Dec. 16, 1969

D. J. DEVITT 3,484,341

ELECTROPLATED CONTACTS FOR SEMICONDUCTOR DEVICES

Filed Sept. 7, 1966

INVENTOR.
DOUGLAS J. DEVITT
BY
Arthur L. Lessler
ATTORNEY

United States Patent Office 3,484,341
Patented Dec. 16, 1969

3,484,341
ELECTROPLATED CONTACTS FOR SEMICONDUCTOR DEVICES

Douglas J. Devitt, North Palm Beach, Fla., assignor to International Telephone and Telegraph Corporation, a corporation of Delaware Filed Sept. 7, 1966, Ser. No. 577,768
Int. Cl. H01l 7/64; C23b 5/48
U.S. Cl. 204—15 10 Claims

ABSTRACT OF THE DISCLOSURE

This is a method of fabricating improved contacts to semiconductors by providing a temporary interconnection lead pattern electrically connecting together various contact areas on a given master semiconductor wafer, coating the wafer with an insulating layer while providing holes therein so as to expose said contact areas, electroplating the desired contacts to the contact areas wherein said lead pattern surface serves as an electrode during the electro deposition, and passing a pulse of current through a necked portion of reduced cross-section of certain interconnecting leads so as to open these selected leads in order to isolate designated contact areas.

Figure 1:
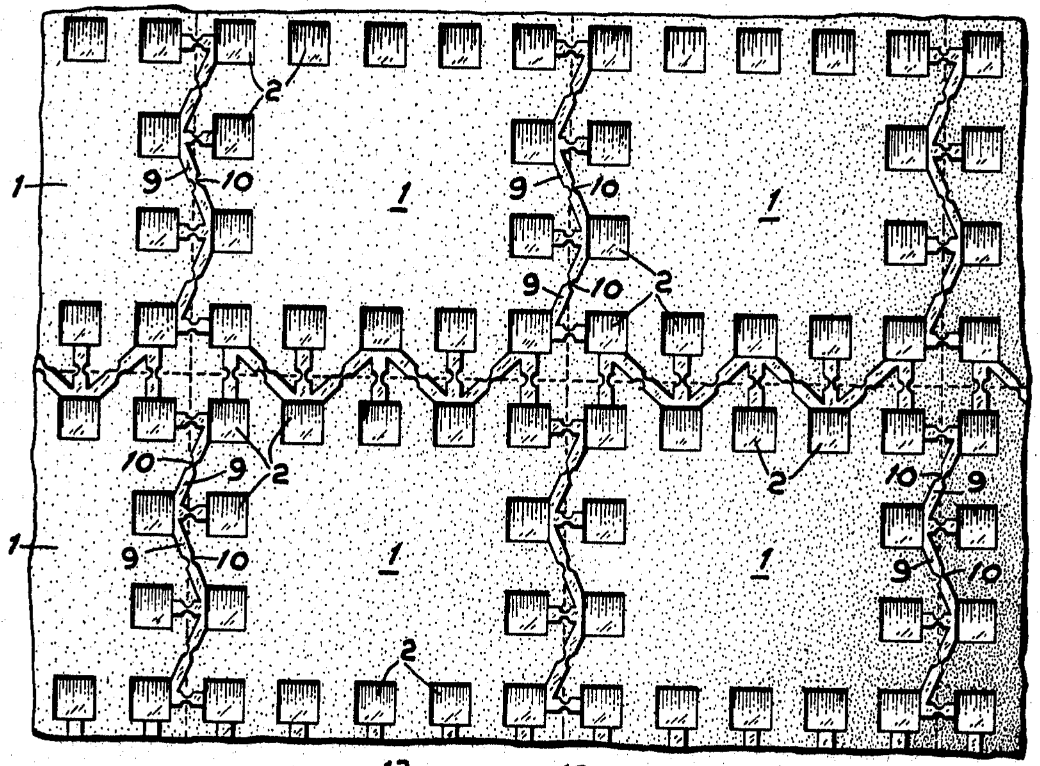

This invention relates to novel processes for the fabrication of improved contacts to semiconductor devices, and more particularly to the utilization of electroplating techniques in conjunction with such fabrication processes.

In the manufacture of semiconductor devices, in particular monolithic integrated circuits, it is common practice to utilize so-called metal-over-oxide "expanded" contacts for electrical connection to active or passive circuit elements formed in a semiconductor substrate. In the manufacture of such devices, one or more active regions of specified conductivity type are generally formed within the semiconductor substrate, each of said regions having a portion contiguous with a given surface of the substrate. A suitable insulating layer is deposited on said given surface either before, during, or after formation of the aforementioned regions. A metallic layer is then deposited on said insulating layer, the metallic layer contacting a corresponding region of the semiconductor through an aperture in the insulating layer. The metallic layer may have a fairly large area at a point on the insulating layer removed from the semiconductor region to which it is electrically connected. External connections to the semiconductor device are made to this large "expanded" area.

The metallic layer used for such interconnection purposes is generally deposited by vacuum deposition techniques. The number of metallic substances which may be practically utilized in such deposition processes is limited, the most commonly used substance being aluminum. Unfortunately, aluminum is not soft solderable, so that external connection to the "expanded" aluminum contact areas must be accomplished by techniques other than soldering. Typically, ultrasonic or thermo-compression bonding methods are employed, such methods having the disadvantage of not being adaptable to batch process operations.

Accordingly, an object of the present invention is to provide improved contacts for semiconductor devices.

Another object of the invention is to provide solderable contacts for semiconductor devices to facilitate the making of electrical connections thereto.

Still another object of the invention is to provide such solderable contacts by means of electro-deposition techniques.

These, and other objects which will become apparent by reference to the following detailed description taken in conjunction with the accompanying drawings and appended claims, are accomplished by providing a temporary interconnection lead pattern electrically connecting together the contact areas on a given master semiconductor wafer, coating the wafer with an insulating layer which leaves only said contact areas exposed, electroplating the contact areas by means of the temporary interconnection lead pattern, and finally opening the lead pattern to isolate the electroplated contact areas.

The invention will be best understood by reference to the following detailed description and the accompanying drawings, in which:

FIGURE 1 shows a portion of a semiconductor wafer having integrated circuits thereon interconnected by a temporary lead pattern according to the invention; and FIGURE 2 shows a cross sectional view of a portion of one of said integrated circuits during various steps in the practice of the novel process according to the invention.

Referring to FIGURE 1, there is shown a greatly enlarged view of a small area of a master silicon semiconductor wafer upon which a plurality of integrated circuits has been formed by diffusion, deposition, and/or selective etching processes. The various active elements of each integrated circuit are connected by internal metallization patterns to corresponding contact areas 2. A lead pattern comprised of a plurality of leads 9 interconnects all the contact areas.

Figure 2A:
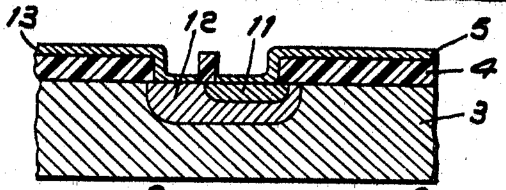

FIGURE 2A shows a portion of one of the integrated circuits of FIGURE 1. This portion contains an electrical circuit element within a semiconductor die 3, in this case a diode, comprising a first region 11 of one conductivity type and a second contiguous region 12 of opposite conductivity type, with a P-N junction therebetween. An insulating layer 4, which may typically be comprised of silicon dioxide, covers the surface of the wafer to which the first and second regions are contiguous. Metallic layers 5 and 13 extend over the insulated layer 4 and make electrical contact to first region 11 and second region 12 respectively through corresponding apertures in the insulating layer 4.

The metallic layers 5 and 13 may extend to corresponding contact areas of the same circuit or of other microcircuits on the same master wafer, or simply make electrical contact to other semiconductor elements on said wafer. The metallic layers 5 and 13, however, preferably extend to such other contact areas or other circuit elements in such a manner that they cross an interface between adjacent integrated circuits on said wafer. This is more readily seen by reference to FIGURE 1 in which it is observed that each portion 9 of the temporary interconnection lead pattern connecting any two contact areas 2 crosses over an interface between adjacent integrated circuits, said interfaces being indicated by the dashed lines in FIGURE 1.

Figure 2B:
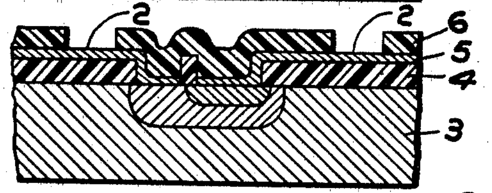

In FIGURE 2B, contact areas 2 are associated with the circuit element comprised of the contiguous regions 11 and 12. The temporary interconnection lead pattern comprised of the interconnecting members 9 may be formed simultaneously with the metallic "expanded" contacts 5 and 13 or subsequent to the formation thereof.

In accordance with the present invention, an additional insulating layer 6, e.g. of silicon dioxide, is pyrolytically deposited on the surface of the master semiconductor wafer and apertures are opened therein to expose the contact areas 2. The entire master wafer is then imemrsed in a suitable electroplating solution which may be comprised, e.g., of a solution of silver cyanide, potassium cyanide, potassium carbonate and water in the relative proportions of 350:392:52:2700 by weight—and a suitable solderable metal, such as silver when the aforementioned solution is employed, is electroplated onto the contact areas 2 to form the solderable contacts 7. The electroplating is carried out at a suitable plating current and for a suitable time to produce the desired thickness of silver on the contact areas. Typically a plating current of 30 ma. and plating time of 6 minutes may be employed. During this electroplating process, the temporary interconnection lead pattern comprising the interconnecting elements 9 is employed to provide electrical conductivity to all the contact areas 2 to be plated. The resultant structure is shown at C in FIGURE 2, wherein it is seen that the electroplated contacts 7 are raised substantially above the level of the surrounding insulating layer 6 and extend outwardly over said insulating layer.

Figure 2C:
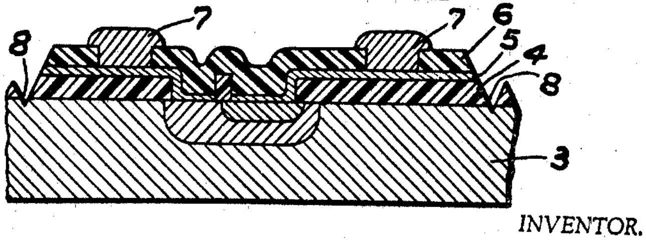

It is now necessary to open the temporary interconnection lead pattern in order to electrically isolate the various contact areas 2 from each other. This may be accomplished, e.g., by employing a sharp chisel-like instrument to pierce the insulating layer 6 and the underlying portion of each interconnecting element 9, preferably at the interface between adjacent integrated circuits. The results of this chiseling action are shown in FIG. 2C where insulating layer 6, metallic layer 5 and insulating layer 4 are cut through forming valley 8. In order to facilitate such lead disconnection, each interconnecting lead 9 is provided with a necked portion 10 of reduced cross section. An alternate technique for severing the interconnecting members 9 is to utilize a two-point probe to pass a current pulse through the necked portion 10 of each interconnecting member 9 thereby to vaporize said portion.

The next step is to sever the various integrated circuits 1 from each other along the interfaces designated by the dashed lines in FIGURE 1. Conventional scribing and breaking techniques may be employed for such separation.

It will be appreciated that alternative techniques may be employed for the electrical or mechanical opening of the interconnecting members 9. For example, the members 9 may be opened by selective etching thereof. Where each interconnecting element 9 crosses an interface between adjacent circuits 1, the temporary lead pattern may be opened merely by severing the integrated circuits 1 from the master wafer. In some cases it may be desirable to utilize temporary interconnections directly between contact areas on the same integrated circuit, in which case suitable electrical or mechanical opening techniques along the lines previously mentioned may be employed. Since the action of the chisel-like tool employed to break the interconnecting members 9 need not crack the underlying semiconductor, interconnections between contacts on the same substrate are susceptible of severance by this technique.

It should also be recognized that elevated electroplated contacts may be produced by multiple applications of applicant's novel process to the same master semiconductor wafer. For example, referring to FIGURE 2C, a third insulating layer could be deposited atop the additional insulating layer 6 and apertures opened therein exposing a limited area of the raised contacts 7. The semiconductor wafer could again be electroplated, thus producing another tier of electroplated contacts. This "stacking technique" is preferable to a single electroplating operation, in order to minimize lateral expansion of the resultant raised contacts.

While the principles of the invention have been described above in connection with specific embodiments, and particular modifications thereof, it is to be clearly understood that this description is made only by way of example and not as a limitation on the scope of the invention.

What is claimed is:

1. A process for fabricating from a master semiconductor wafer a plurality of semiconductor devices, each having at least one electroplated contact thereon, each of said devices being contained on a corresponding semiconductor die, comprising the steps of:

forming at least one electrical circuit element in each of a plurality of respective limited areas of said wafer corresponding to each of said die, each said die having at least one contact area thereon associated with each said corresponding circuit element, each contact area being disposed on a given surface of said wafer;

forming on said given surface a pattern of temporary conductive leads electrically interconnecting said contact areas, certain selected interconnecting leads being provided with a necked portion of reduced cross-section;

depositing on said surface an insulating layer overlying said pattern and exposing only said contact areas;

electro-depositing a metallic layer on each of said exposed contact areas, said lead pattern serving as one electrode during said electro-deposition step; and passing a pulse of current through said necked portion of said certain interconnecting leads so as to open said lead pattern to isolate designated interconnected contact areas.

2. A process according to claim 1, wherein said electro-deposited metallic layer is soft solderable.

3. A process according to claim 2, wherein said electro deposited metallic layer comprises silver.

4. A process according to claim 1, wherein each link of said conductive lead pattern interconnecting any two of said contact areas crosses an interface between adjacent ones of said semiconductor devices.

5. A process according to claim 4, wherein at least one of said links has a necked portion of reduced cross section at said interface.

6. A process according to claim 1, wherein said lead pattern is opened by severing with a chisel-like instrument each portion thereof interconnecting any two contact areas.

7. A process according to claim 1, wherein said lead pattern is opened by severing said dice from said master wafer.

8. A process according to claim 5, wherein said at least one link is opened by passing a current pulse therethrough to vaporize at least a part of said necked portion.

9. A process according to claim 1, wherein said lead pattern is opened by selective etching thereof.

10. A process according to claim 1, wherein said contact areas are further raised before said lead pattern is opened, comprising the steps of:

after said electro-depositing step, depositing an additional insulating layer on said surface having apertures exposing only a portion of the metallic layer electro-deposited on each of said contact areas; and electro-depositing an additional conductive layer on said metallic layer through the apertures in said additional insulating layer.

References Cited

UNITED STATES PATENTS

| | | | |
|---|---|---|---|
| 3,208,921 | 9/1965 | Hill | 204—15 |
| 3,060,076 | 10/1962 | Robinson | 204—15 |
| 3,408,271 | 10/1968 | Reissmueller et al. | 204—15 |

JOHN H. MACK, Primary Examiner

T. TUFARIELLO, Assistant Examiner